United States Patent
Harada et al.

(10) Patent No.: US 12,318,846 B2
(45) Date of Patent: Jun. 3, 2025

(54) DIAMOND TOOL

(71) Applicant: SUMITOMO ELECTRIC HARDMETAL CORP., Hyogo (JP)

(72) Inventors: Takashi Harada, Hyogo (JP); Satoru Kukino, Hyogo (JP); Naoki Watanobe, Hyogo (JP)

(73) Assignee: SUMITOMO ELECTRIC HARDMETAL CORP., Hyogo (JP)

( * ) Notice: Subject to any disclaimer, the term of this patent is extended or adjusted under 35 U.S.C. 154(b) by 586 days.

(21) Appl. No.: 17/634,981

(22) PCT Filed: Dec. 4, 2020

(86) PCT No.: PCT/JP2020/045241
§ 371 (c)(1),
(2) Date: Feb. 13, 2022

(87) PCT Pub. No.: WO2022/118461
PCT Pub. Date: Jun. 9, 2022

(65) Prior Publication Data
US 2022/0355388 A1    Nov. 10, 2022

(51) Int. Cl.
*B32B 27/20* (2006.01)
*B23B 27/20* (2006.01)
*B23C 5/16* (2006.01)

(52) U.S. Cl.
CPC .............. *B23B 27/20* (2013.01); *B23C 5/16* (2013.01); *B23B 2226/315* (2013.01)

(58) Field of Classification Search
None
See application file for complete search history.

(56) References Cited

U.S. PATENT DOCUMENTS 5,178,645 A    1/1993  Nakamura
2017/0191168 A1*  7/2017  Paseuth ............... C23C 16/403

FOREIGN PATENT DOCUMENTS

| JP | 04-193406 A | 7/1992 |
| JP | H06-297207 A | 10/1994 |
| JP | 2005-088178 A | 4/2005 |

(Continued)

OTHER PUBLICATIONS

English translation of Jo et al. (JP 2020/040170) (Year: 2020).*

*Primary Examiner* — Ronak C Patel
(74) *Attorney, Agent, or Firm* — Renner, Otto, Boisselle & Sklar, LLP

(57) ABSTRACT

A diamond tool includes a diamond at least on a cutting edge includes a diamond phase composed of a diamond crystal structure and a graphite phase composed of a graphite crystal structure. When a ratio $I_{\pi^*}/I_{\sigma^*}$ between an intensity of a $\pi^*$ peak derived from a $\pi$ bond of carbon in the graphite phase and an intensity of a $\sigma^*$ peak derived from a $\sigma$ bond of carbon in the graphite phase and a $\sigma$ bond of carbon in the diamond phase is determined for the diamond grain by measuring an energy loss associated with excitation of K-shell electrons of carbon by electron energy loss spectroscopy, the ratio $I_{\pi^*}/I_{\sigma^*}$ of the diamond grain on a surface of the cutting edge is 0.1 to 2 and a ratio $I_{\pi^*}/I_{\sigma^*}$ of the diamond grain at a depth position of 0.5 μm from the surface of the cutting edge is 0.001 to 0.1.

4 Claims, 1 Drawing Sheet

(56) References Cited

FOREIGN PATENT DOCUMENTS

| JP | 2018-168397 | A | 11/2018 |
|----|-------------|----|---------|
| JP | 2020-40170 | A | 3/2020 |
| JP | 2020-44640 | A | 3/2020 |
| WO | 2021/079586 | A1 | 4/2021 |

* cited by examiner

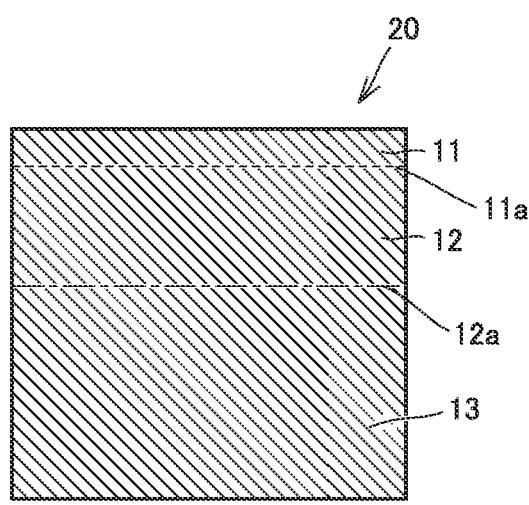

DIAMOND TOOL

TECHNICAL FIELD

The present disclosure relates to a diamond tool.

BACKGROUND ART

Conventionally, when processing work materials that are difficult to cut, for example, nonferrous metals such as aluminum alloys, carbon fiber reinforced plastics (CFRP), glass fiber reinforced plastics (GFRP), ceramics, ceramic matrix composites (CMC), and cemented carbides, diamond tools having a cutting edge that is substantially composed of diamond generally been used. However, for this kind of work material, a cutting oil (hereinafter also referred to as "coolant") often cannot be used during the processing. In this case, the wear of the cutting edge becomes severe during machining, and therefore it is required to have improved wear resistance for the diamond tool.

To meet this requirement, Japanese Patent Laid-Open No. 2005-088178 (PTL 1) discloses a diamond sintered body tool in which a graphite layer has been actively precipitated on a flank face by electric discharge machining. It is stated that this diamond sintered body tool has improved flank face wear resistance as a result of the lubricating properties of the graphite layer.

CITATION LIST

Patent Literature

PTL 1: Japanese Patent Laying-Open No. 2005-088178

SUMMARY OF INVENTION

A diamond tool according to the present disclosure includes a diamond at least on a cutting edge. The diamond includes one or two or more diamond grains. Each diamond grain includes a diamond phase composed of a diamond crystal structure and a graphite phase composed of a graphite crystal structure. When a ratio $I_{\pi*}/I_{\sigma*}$ between an intensity of a $\pi*$ peak derived from a $\pi$ bond of carbon in the graphite phase and an intensity of a $\sigma*$ peak derived from a $\sigma$ bond of carbon in the graphite phase and a $\sigma$ bond of carbon in the diamond phase is determined for the diamond grain by measuring an energy loss associated with excitation of K-shell electrons of carbon by electron energy loss spectroscopy using a transmission electron microscope, the ratio $I_{\pi*}/I_{\sigma*}$ of the diamond grain on a surface of the cutting edge is 0.1 to 2 and the ratio $I_{\pi*}/I_{\sigma*}$ of the diamond grain at a depth position of 0.5 μm in a normal direction to the surface of the cutting edge from the surface of the cutting edge is 0.001 to 0.1.

BRIEF DESCRIPTION OF DRAWING

FIG. 1 is an explanatory view illustrating a part of a cross-section obtained by cutting a diamond grain located on the surface of a cutting edge of a diamond tool according to the present embodiment at a face parallel to the normal direction of the surface of the cutting edge.

DETAILED DESCRIPTION

Problem to be Solved by the Present Disclosure

In the diamond sintered body tool disclosed in PTL 1, the ratio of the diamond on the surface of the cutting edge is lower, and therefore the cutting edge strength is insufficient for cutting materials that are difficult to cut such as cemented carbides. As a result, there is room for improvement in that there is a tendency for defects to frequently occur. Therefore, diamond tools with excellent defect resistance as a result of having the sufficient cutting edge strength required for cutting materials that are difficult to cut while maintaining excellent wear resistance based on the lubricating properties of the graphite layer are yet to be realized, and the development of such diamond tools is desired.

In view of the above situation, it is an object of the present disclosure to provide a diamond tool having improved defect resistance in particular.

Advantageous Effect of the Present Disclosure

According to the present disclosure, a diamond tool having improved detect resistance in particular can be provided.

DESCRIPTION OF EMBODIMENTS

As a result of diligent investigation into solving the above-mentioned problem, the present inventors arrived at the present disclosure. Specifically, in the step of forming a tool shape from a diamond (e.g. a single crystal diamond or a binderless polycrystalline diamond) using a laser and finishing the cutting edge shape, the present inventors focused on producing a moderate amount of a graphite phase that does not adversely affect the strength in the diamond phase of the diamond grains located on the surface of the cutting edge. In such a case, the present inventors discovered that the sliding properties of the tool are improved based on a lubrication effect by the graphite phase, and based on this discovery arrived at a diamond tool having remarkably improved defect resistance coupled with the hardness inherent in diamond grains.

Firstly, embodiments of the present disclosure will be described.

[1] A diamond tool according to one mode of the present disclosure includes a diamond at least on a cutting edge. The diamond includes one or two or more diamond grains. Each diamond grain includes a diamond phase composed of a diamond crystal structure and a graphite phase composed of a graphite crystal structure. When a ratio $I_{\pi*}/I_{\sigma*}$ between an intensity of a $\pi*$ peak derived from a $\pi$ bond of carbon in the graphite phase and an intensity of a $\sigma*$ peak derived from a $\sigma$ bond of carbon in the graphite phase and a $\sigma$ bond of carbon in the diamond phase is determined for the diamond grain by measuring an energy loss associated with excitation of K-shell electrons of carbon by electron energy loss spectroscopy using a transmission electron microscope, the ratio $I_{\pi*}/I_{\sigma*}$ of the diamond grain on a surface of the cutting edge is 0.1 to 2 and the ratio $I_{\pi*}/I_{\sigma*}$ of the diamond grain at a depth position of 0.5 μm in a normal direction to the surface of the cutting edge from the surface of the cutting edge is 0.001 to 0.1. A diamond tool having such characteristics can have improved defect resistance.

[2] It is preferred that the ratio $I_{\pi*}/I_{\sigma*}$ of the diamond grain at a depth position of 0.2 μm in a normal direction to the surface of the cutting edge from the surface of the cutting edge is 0.001 to 0.1. As a result the defect resistance of the diamond tool can be further improved.

[3] It is preferred that the diamond is a single crystal diamond, a binderless polycrystalline diamond, or a polycrystalline sintered diamond. As a result, in a diamond tool having a single crystal diamond, a binderless polycrystalline diamond, or a polycrystalline sintered diamond for the cutting edge, defect resistance can be further improved.

[4] It is preferred that the diamond tool includes a rake face, a flank face, and a ridgeline where the rake face and the flank face intersect, that the rake face is continuous with the flank face via the ridgeline, that the cutting edge of the diamond tool is constituted from a part of the rake face, a part of the flank face, and the ridgeline, and that the surface of the cutting edge is at least a part of the surfaces of the cutting edge. As a result, the defect resistance at the cutting edge of the diamond tool can be improved.

Details of Embodiment of Present Disclosure

Hereinafter, an embodiment of the present disclosure (hereinafter referred to as "the present embodiment") will be described in detail. In the following description, the notation in the form "A to B" means the upper limit and the lower limit of the range (that is, A or more and B or less), and when there is no description of the unit for A and the unit is described only for B, the unit of A and the unit of B are the same.

Diamond Tool

The diamond tool according to the present embodiment is a diamond tool having a diamond at least on a cutting edge. The diamond tool can significantly improve defect resistance compared with this kind of conventionally known diamond tool based on the characteristics of the diamond grain in the diamond on the cutting edge. For this reason, as a cutting tool, the diamond tool according to the present embodiment is suitable for applications in, for example, drills, end mills, cutting-edge-replaceable cutting tips for drills, cutting-edge-replaceable cutting tips for end mills, cutting-edge-replaceable cutting tips for mills, cutting-edge-replaceable cutting tips for turning, metal saws, tooth cutting tools, reamers, taps, and the like. Further, the diamond tool is also suitable for applications such as anti-wear tools such as dies, scribers, scribing wheels, dressers, and grinding tools such as grinding grindstones.

As used herein, "cutting edge" means the portion of the cutting part of the diamond tool that is directly involved in the processing of a work material. Further, the surface of the "cutting edge" is defined as "the surface of the cutting edge". The position of the "cutting edge surface" is a position at a depth of 0 μm in the normal direction to the surface of the cutting edge from the surface of the cutting edge. As used herein, "rake face" means the face that scoops out the chips scraped from the work material at the time of cutting, and "flank face" means the face facing the face being cut of the work material at the time of cutting. It is preferred that the diamond tool includes a rake face, a flank face, and a ridgeline where the rake face and the flank face intersect. In this case, the rake face is continuous with the flank face via the ridgeline. Further, the cutting edge of the diamond tool is preferably constituted from a part of the rake face, a part of the flank face, and the ridgeline, and the surface of the cutting edge is preferably at least a part of the surface of the cutting edge (at least any one of a part of the surface of the rake face, a part of the surface of the flank face, and on the ridgeline). The cutting edge of the diamond tool according to the present embodiment may be constituted from the ridgeline and a region 500 μm away from each of the rake face side and the flank face side.

Here, the shape of the cutting edge may be, for example, a sharp edge (a ridge where the rake face and the flank face intersect), a honed edge (a sharp edge processed to be rounded), a negative land (chamfered), and a shape combining a honed edge and a negative land. For this reason when the cutting edge has a sharp edge shape, the cutting edge has a ridgeline at the interface where the rake face and flank face intersect, but in cases where the cutting edge has a honed shape or a negative land shape, the cutting edge does not have the ridgeline. However, the present specification will be described as if, even in these cases, a virtual rake face from which the rake face of the diamond tool extends, a virtual flank face from which the flank face extends, and a virtual ridgeline where the virtual face and the virtual flank face intersect exist in the portion where the honed edge and negative land are formed.

The diamond tool according to the present embodiment has a diamond at least on the cutting edge as described above. The diamond tool preferably has an integrated structure in which the diamond and a base metal are combined with an adhesive layer. Any conventionally known base metal can be used as a substrate used for this type of tool. The material of this base metal is preferably, for example, any of a cemented carbide (e.g., WC-based cemented carbide, WC, as well as a material including Co or to which a carbonite of Ti, Ta, Nb or the like has been added), a cermet (having TiC, TiN, TiCN or the like as a main component), high-speed steel, and ceramics (titanium carbide, silicon carbide, silicon nitride, aluminum nitride, aluminum oxide, and the like).

Among these, it is preferred to select a cemented carbide (particularly a WC-based cemented carbide) or a cermet (especially a TiCN-based cermet) as the material of the base metal. These materials have an excellent balance between hardness and strength at high temperatures, and therefore have preferable properties for applications where diamond tools are used. When a WC-based cemented carbide is used as the base metal, the structure may include free carbon and an irregular layer called an η phase or ε phase. Further, the base metal may have a modified surface. For example, in the case of a cemented carbide, a β-free layer may be formed on the surface, and in the case of a cermet, a surface hardened layer may be formed. The base material exhibits desired effects even if its surface is modified. When the diamond tool is a drill or an end mill, the base material is sometimes referred to as a shank, for example. In addition, when the diamond tool is a cutting-edge-replaceable cutting tip or the like, the base material may or may not have a chip breaker. Moreover, the diamond tool according to the present embodiment may be a mode that does not include a base material, and may have a mode composed of only a diamond, for example. The diamond tool can also include a coating covering at least part of the cutting edge including the rake face, the flank face, and the ridgeline where the rake face and the flank face intersect.

Diamond

The diamond tool according to the present embodiment has a diamond at least on the cutting edge as described above. Specifically, the diamond is preferably a single crystal diamond (hereinafter also referred to as "SCD"), a binderless polycrystalline diamond (hereinafter referred to as "BLPCD"), or a polycrystalline sintered diamond (hereinafter also referred to as "PCD").

For example, if the diamond is an SCD, the SCD can be prepared by performing a conventionally known manufacturing method such as a high-temperature and high-pressure synthesis (HTHP) method or a chemical vapor deposition (CVD) method.

If the diamond is a BLPCD, the BLPCD can be prepared by converting graphite as a starting material into diamond grains by the above-mentioned HTHP method, and at the same time bonding the diamond grains by sintering them without using a binder. For example, the BLPCD can be produced by directly converting the graphite into diamond grains under high temperature and pressure of 1800 to 2500° C. and 15 to 25 GPa while at the same time sintering the diamond grains. In other words, the BLPCD is a polycrystalline diamond in which diamond grains are bonded to each other without using a binder (binding material).

If the diamond is a PCD, the PCD can be prepared by sintering a mixture obtained by mixing diamond grains and a binding material. In this case, the content of the diamond grain in the PCD is preferably 80% by volume or more or 99% by volume or less with respect to the total amount (100% by volume of the PCD), and the total content of the binding material and unavoidable impurities is preferably 1% by volume or more and 20% by volume or less.

If the content of the diamond grains is 80% by volume or more of the total amount of the PCD, defect resistance is improved because the strength of the PCD is maintained at a high level based on the physical properties of the diamond grains. On the other hand, if the content of the diamond grains is 99% by volume or less with respect to the total amount of the PCD, the amount of binding material required for the bonding between the diamond grains can be secured, and therefore an increase in flaws can be suppressed. As a result, defect resistance improves because the occurrence of defects caused by flaws can be prevented. The content of the diamond grains in the PCD is more preferably 85% by volume or more and 97% by volume or less with respect to the total amount of the PCD.

The binding material preferably includes at least one element selected from Group 8, 9 and 10 elements (iron group elements: Fe, Co, and Ni) in the periodic table, as well as any of these elements dissolved with each other in the solid state. The binding material is, specifically, Co, Co—Fe, Ni—Co, and the like.

Here, the SCD and BLPCD has a carbon content of substantially 100% by volume excluding impurity elements. The content of the impurity elements is more preferably 5% by mass or less. The impurity elements may be one or more metal elements selected from the group consisting of rare earth elements, alkaline earth metals, Co, Fe, Ni, Ti, W, Ta, Cr, and V. In addition, the impurity elements may also be one or more nonmetallic or semimetallic elements selected from the group consisting of nitrogen, oxygen, boron, silicon, and hydrogen. The SCD and BLPCD may has an impurity element content of 0% by mass. The type and content of the impurity elements can be determined, for example, by using secondary ion mass spectrometry (SIMS: Secondary Ion Mass Spectrometry).

Further, if the diamond is a BLPCD or PCD, the $D_{50}$ (average grain size) of the diamond grain constituting the BLPCD or PCD is not particularly limited and can be, for example, 0.005 to 100 µm. Usually, the smaller the $D_{50}$, the harder the BLPCD or PCD tends to be, and the smaller the grain size variation, the more homogeneous the properties of the BLPCD or PCD tend to be.

The $D_{50}$ of the diamond grains constituting the BLPCD or PCD can be determined by analyzing a structural photograph of the BLPCD or PCD captured by a scanning electron microscope (SEM, trade name: "JSM-7800F", manufactured by JEOL, Ltd.) using commercially available image analysis software (trade name: "Win ROOF", from Mitani Corporation). More specifically, first, a sample of the BLPCD or PCD is taken from the cutting edge of a diamond tool manufactured based on the manufacturing method described later, and the surface of the BLPCD or PCD sample is mirror polished. Next, by observing the reflected electron image of the mirror polished surface of the sample at a magnification of 5000 to 20000 times using the SEM, a plurality of diamond grains are identified from the reflected electron image, and the circle equivalent diameter of each diamond grain in the reflected electron image is calculated using the image analysis software. Preferably, the circle equivalent diameter of 100 or more diamond grains is calculated by observing 5 fields of view or more.

Next, a cumulative distribution is obtained by arranging each circle equivalent diameter in ascending order from the minimum value to the maximum value. In the cumulative distribution, the grain size at 50% of the cumulative area becomes $D_{50}$. It is noted that circle equivalent diameter means the diameter of a circle having the same area as the measured diamond grain area.

Abundance Ratio of Graphite in Diamond Grain (Ratio $I_{\pi*}/I_{\sigma*}$)

The diamond located on the cutting edge in the diamond tool according to the present embodiment includes one or two or more diamond grains as described above. Each diamond grain includes a diamond phase composed of a diamond crystal structure and a graphite phase composed of a graphite crystal structure. When a ratio $I_{\pi*}/I_{\sigma*}$ between an intensity of a π* peak derived from a π bond of carbon in the graphite phase and an intensity of a σ* peak derived from a σ bond of carbon in the graphite phase and a σ bond of carbon in the diamond phase is determined for the diamond grain by measuring an energy loss associated with excitation of K-shell electrons of carbon by electron energy loss spectroscopy using a transmission electron microscope (hereinafter referred to as "TEM-EELS"), the ratio $I_{\pi*}/I_{\sigma*}$ of the diamond grain on a surface of the cutting edge is 0.1 to 2 and a ratio $I_{\pi*}/I_{\sigma*}$ of the diamond grain at a depth position of 0.5 µm in a normal direction to the surface of the cutting edge from the surface of the cutting edge is 0.001 to 0.1. As a result, the diamond tool can have improved defect resistance.

Thus, the diamond tool according to the present embodiment has a ratio $I_{\pi*}/I_{\sigma*}$ of the diamond grain on the surface of the cutting edge of 0.1 to 2 and a ratio $I_{\pi*}/I_{\sigma*}$ of the diamond grain at a depth position of 0.5 µm in a normal direction to the surface of the cutting edge from the surface of the cutting edge of 0.001 to 0.1. As a result, the diamond tool can have graphite in a moderate ratio that does not adversely affect the strength of the diamond tool at the cutting edge. In this case, the graphite on the surface of the cutting edge plays a lubricant-like role based on its softness, thereby improving the sliding properties of the tool and thus improving defect resistance. In particular, it is preferred that the ratio $I_{\pi*}/I_{\sigma*}$ of the diamond grain at a depth position of 0.2 µm in a normal direction to the surface of the cutting edge from the surface of the cutting edge is 0.001 to 0.1. In this case, the defect resistance of the diamond tool can be further improved.

Here, with reference to FIG. 1, the diamond grains located on the surface of the cutting edge will now be described. FIG. 1 is an explanatory diagram illustrating a part of a cross section obtained by cuttin a diamond grain located on the surface of the cutting edge of the diamond tool according to the present embodiment at a face parallel to the normal direction of the surface of the cutting edge. In FIG. 1, the diamond grain is an SCD. That is, the cross-section illustrated in FIG. 1 is obtained by cutting one diamond grain constituting the SCD at a face parallel to the normal direction of the surface of the cutting edge. A diamond grain 20 of FIG. 1 has a first region 11 and a second region 12 in that order from the surface of the cutting edge in the direction toward a cutting edge internal region 13. First region 11 is a region to a depth position 11a of 0.2. μm in the normal direction to the surface of the cutting edge from the surface of the cutting edge. Second region 12 is a region from the interface with the depth position 11a to a depth position 12a of 0.5 μm in the normal direction to the surface of the cutting edge from the surface of the cutting edge.

In diamond grain 20, first region 11, second region 12, and cutting edge internal region 13 are integrally inseparable. As used herein, "integral inseparable" means that the crystal lattice constituting diamond grain 20 at the interface between first region 11 and second region 12 and at the interface between second region 12 and cutting edge internal region 13 is continuous, and that the crystal lattice at the interface between first region 11 and second region 12 and at the interface between second region 12 and cutting edge internal region 13 is not cleaved open. That is, as used herein, the interface between first region 11 and second region 12 and the interface between second region 12 and cutting edge internal region 13 are both for convenience refer to interfaces that are arranged on a cross-section of diamond grain 20 in order to measure a ratio $I_{\pi^*}/I_{\sigma^*}$ representing the abundance ratio of graphite in diamond grain 20 at each of depth position 11a of 0.2 μm in the normal direction to the surface of the cutting edge from the surface of the cutting edge and depth position 12a of 0.5 μm in the normal direction to the surface of the cutting edge from the surface of the cutting edge. Hereinafter a method for measuring the ratio $I_{\pi^*}/I_{\sigma^*}$ representing the abundance ratio of graphite using TEM-EELS will be described.

Method for Measuring Graphite Abundance Ratio (Ratio $I_{\pi^*}/I_{\sigma^*}$) Using TEM-EELS First, a diamond tool is manufactured based on the manufacturing method described later. Next, a sample of a diamond (SCD, BLPCD, or PCD, but in FIG. 1, SCD) is taken from the cutting edge of the diamond tool, and the sample is cut at a face parallel to the normal direction of the surface of the cutting edge using an argon ion slicer to produce a section having a thickness of 3 to 100 nm. Further, a cross-sectional transmission image of diamond grain 20 located on the surface of the cutting edge in the sample is obtained by observing the section at 100,000 to 1 million times magnification using a transmission electron microscope (TEM, trade name: "JEM-2100F/Cs", manufactured by JEOL, Ltd.).

Next, in the cross-sectional transmission image, the surface position of the cutting edge in diamond grain 20, depth position 11a of 0.2 μm in the normal direction to the surface of the cutting edge from the surface of the cutting edge in diamond grain 20, and depth position 12a of 0.5 μm in the normal direction to the surface of the cutting edge from the surface of the cutting edge in diamond grain 20 are each identified. Further, using electron energy loss spectroscopy (EELS), at the surface position of the cutting edge in diamond grain 20, depth position 11a of 0.2 μm in the normal direction to the surface of the cutting edge from the surface of the cutting edge, and depth position 12a of 0.5 μm in the normal direction to the surface of the cutting edge from the surface of the cutting edge, the energy loss (K edge) associated with the excitation of carbon K-shell electrons is observed by scanning 1 nm observation spots over 10 nm in the direction parallel to the cutting edge surface, for example. As a result, an energy loss curve around 300 eV associated with the excitation of the carbon K-shell electrons is drawn for each of the surface position of the cutting edge of diamond grain 20, depth position 11a of 0.2 μm in the normal direction to the surface of the cutting edge from the surface of the cutting edge, and depth position 12a of 0.5 μm in the normal direction to the surface of the cutting edge from the surface of the cutting edge.

Finally, from the energy loss curve drawn based on the observation at the surface position of the cutting edge of diamond grain 20, the intensity of a π* peak ($I_{\pi^*}$) derived from the π bond of carbon in the graphite phase, the intensity of a σ* peak ($I_{\sigma^*}$) derived from the σ bond of carbon in the graphite phase and the σ bond of carbon in the diamond phase are obtained. Then, the ratio $I_{\pi^*}/I_{\sigma^*}$ can be obtained by dividing $I_{\pi^*}$ by $I_{\sigma^*}$. The ratio $I_{\pi^*}/I_{\sigma^*}$ can also be obtained in the same way, from the energy loss curve drawn based on the observation at depth position 11a of 0.2 μm in the normal direction to the surface of the cutting edge from the surface of the cutting edge, and the energy loss curve drawn based on the observation at depth position 12a of 0.5 μm in the normal direction to the surface of the cutting edge from the surface of the cutting edge.

In this case, the diamond tool according to the present embodiment preferably has a ratio $I_{\pi^*}/I_{\sigma^*}$ of diamond grain 20 at the surface of the cutting edge of 0.1 to 2 and a ratio $I_{\pi^*}/I_{\sigma^*}$ of diamond grain 20 at depth position 12a of 0.5 μm in a normal direction to the surface of the cutting edge from the surface of the cutting edge of 0.001 to 0.1. In particular, it is preferred that the ratio $I_{\pi^*}/I_{\sigma^*}$ of diamond grain 20 at depth position 11a of 0.2 μm in the normal direction to the surface of the cutting edge from the surface of the cutting edge is 0.001 to 0.1.

In addition, it is preferred that the ratio $I_{\pi^*}/I_{\sigma^*}$ of diamond grain 20 at the surface of the cutting edge is 0.6 to 1 and the ratio $I_{\pi^*}/I_{\sigma^*}$ of diamond grain 20 at depth position 12a of 0.5 μm in a normal direction to the surface of the cutting edge from the surface of the cutting edge is 0.002 to 0.01. More preferably, the ratio $I_{\pi^*}/I_{\sigma^*}$ of diamond grain 20 at depth position 11a of 0.2 μm in the normal direction to the surface of the cutting edge from the surface of the cutting edge is 0.002 to 0.01.

In the measurement method described above, one cross-sectional transmission photograph of the diamond grain located on the surface of the cutting edge is prepared for the rake face side and for the flank face side of the cutting edge (a total of two photographs are prepared). When the ratio $I_{\pi^*}/I_{\sigma^*}$ of the diamond grain on the surface of the cutting edge and the ratio $I_{\pi^*}/I_{\sigma^*}$ of the diamond grain at the depth position of 0.5 μm in the normal direction to the surface of the cutting edge from the surface of the cutting edge are determined based on these two cross-sectional transmissive photographs of the diamond grain, the diamond tool to be measured can have improved defect resistance by satisfying those ratios in at least one of the cross-sectional transmission photographs. When the diamond tool satisfies those ratios in both of the two cross-sectional transmission photographs, detect resistance can be improved even more remarkably. The ratio $I_{\pi^*}/I_{\sigma^*}$ means the ratio between the peak value of a π* peak and the peak value of a σ* peak. Further, the π* peak and σ* peak can be obtained by adding the results of, for example, scanning 1 nm observation spots over 10 nm in the direction parallel to the cutting edge surface, at measurement locations at the surface position of the cutting edge, a depth position of 0.2 μm in the normal direction to the surface of the cutting edge from the surface of the cutting edge, and a depth position of 0.5 μm in the normal direction to the surface of the cutting edge from the surface of the cutting edge, and drawing the calculated addition result as an energy loss curve. Here, the length of the scan of 10 nm can be freely changed between 1 and 100 nm.

In the diamond tool according to the present embodiment, even if the diamond of the cutting edge is BLPCD or PCD, the ratio $I_{\pi*}/I_{o*}$ value of the diamond grain for each of the surface position of the cutting edge, the depth position of 0.2 μm in the normal direction to the surface of the cutting edge from the surface of the cutting edge, and the depth position of 0.5 μm in the normal direction to the surface of the cutting edge from the surface of the cutting edge, can be determined in the same way as when the diamond is SCD.

The diamond tool according to the present embodiment may have another diamond grain different from the diamond grain located on the surface of the cutting edge at the depth position of 0.5 μm in a normal direction to the surface of the cutting edge from the surface of the cutting edge or the depth position of 0.2 μm in a normal direction to the surface of the cutting edge from the surface of the cutting edge. However even in this case, as long as the ratio $I_{\pi*}/I_{o*}$ representing the abundance ratio of graphite is measured, it is considered that the ratio $I_{\pi*}/I_{o*}$ at those depth positions is determined by applying the above-described TEM-EELS presuming that the another diamond grain is a diamond grain located on the surface of the cutting edge.

Effects

The diamond tool according to the present embodiment has, as described above, a ratio $I_{\pi*}/I_{o*}$ of the diamond grain on the surface of the cutting edge of 0.1 to 2 and a ratio $I_{\pi*}/I_{o*}$ of the diamond grain at a depth position of 0.5 μm in a normal direction to the surface of the cutting edge from the surface of the cutting edge of 0.001 to 0.1. As a result, the diamond grain located on the cutting edge can have a moderate amount of graphite phase that does not adversely affect the strength of the cutting edge. In this case, the graphite phase plays a lubricant-like role based on its softness, thereby improving the sliding properties of the tool and thus improving defect resistance. Further, the diamond tool according to the present embodiment preferably has a ratio $I_{\pi*}/I_{o*}$ of the diamond grain at a depth position of 0.2 μm in a normal direction to the surface of the cutting edge from the surface of the cutting edge of 0.001 to 0.1. In this case, the defect resistance of the diamond tool can be further improved.

Method for Manufacturing Diamond Tool

The diamond tool according to the present embodiment can be manufactured by performing a conventionally known diamond tool manufacturing method, except for the step of finishing the cutting edge described later performed on the cutting edge. For example, it is preferred to manufacture the diamond tool according to the present embodiment by using the following manufacturing method.

The method for manufacturing the diamond tool according to the present embodiment preferably includes at least a step of preparing a diamond to be located on the cutting edge in the diamond tool (first step), a step of cutting the diamond into a predetermined tool shape (second step), a step of joining the diamond cut into the tool shape with the base material by brazing (third step), and a step of finishing the cutting edge of the diamond tool by performing laser processing on the diamond joined with the material (fourth step). In addition, when the diamond tool is a mode composed of only a diamond, it is not necessary to perform the third step because a base material is not used, and the fourth step may be performed by performing laser processing directly on the diamond cut into the predetermined tool shape in the second step.

First Step

The first step is a step of preparing a diamond to be located on the cutting edge in the diamond tool. In the first step, specifically, a SCD, a BLPCD, or a PCD is prepared as the diamond. All of the SCD, BLPCD, and PCD can be prepared using a conventionally known manufacturing method to obtain the diamond. For example, the SCD can be prepared by using a conventionally known HTHP method, CVD method, or the like. Further, the BLPCD can be prepared by converting graphite into diamond grains by sintering graphite as a starting material using a conventionally known HTHP method, and at the same time bonding the diamond grains together. The PCD can be prepared by sintering a mixture of a binding material and diamond grains produced by a conventionally known HTHP method or the like.

Second Step

The second step is a step of cutting the diamond (SCD or BLPCD) into a predetermined tool shape. The second step can also be performed by a conventionally known method. For example, the diamond can be cut into the predetermined tool shape by at least one of electric discharge machining using a conventionally known electric discharge machining machine, grinding using a grinding machine, or laser processing using a laser processing machine. In other words, the second step is a step of cutting the diamond into the predetermined tool shape by rough processing and precision processing using predetermined means. If the diamond tool is a cutting-edge-replaceable cutting tip for turning, for example, it is preferred to cut into a tip shape 2 to 6 mm long, 1 to 6 mm wide, and 0.3 to 2 mm thick. If the diamond tool is a drill, it is preferred to cut into a cylindrical body having a length of 0.5 to 5 mm and a diameter of 0.5 to 5 mm.

Third Step

The third step is a step of joining the diamond cut into the tool shape with the base material by brazing. The third step can also be performed by a conventionally known method. Specifically the base material is joined by brazing to the end face on the opposite side to that where the cutting edge in the diamond cut into the tool shape is formed. The base material can be prepared with a conventionally known material such as a cemented carbide, as described above. For example, Igetalloy (registered trademark, grade: G10E, AFU, etc.) manufactured by Sumitomo Electric Industries, Ltd. can be suitably used as the material for the base material. The shape of the base material can be formed in accordance with the shape of the diamond. Further, as the brazing, for example, brazing using silver wax is preferable. As a result, in the next step (fourth step), it is convenient to irradiate the laser toward the diamond, and it is easy to subject the cutting edge of the diamond to finishing.

Fourth Step

The fourth step is a step of finishing the cutting edge of the diamond tool by performing laser processing on the diamond joined to the base material. As a result of the fourth step, a graphite phase having the above-described characteristics can be formed in the diamond grain located on the cutting edge. In the fourth step, laser processing can be performed on the diamond grain located on the cutting edge under the following conditions, for example.

For example, in the fourth step, using a picosecond laser, it is preferred to finish the cutting edge of the diamond tool under laser irradiation conditions of a laser wavelength of 532 nm or more and 1064 nm or less, a laser spot diameter of 5 μm or more and 70 μm or less as a half-width, a laser focal depth of 0.5 mm or more and 20 mm or less, a laser output of 1 W or more and 20 W or less at the processing point, and a laser scanning speed of 5 mm/s or more and 100 mm/s or less. In this case, it is preferred to cool the workpiece by spraying compressed air to avoid excessive heating occurring on the surface of the cutting edge. For example, when compressed air is sprayed on the workpiece using a vortex tube (manufactured by Kogi Corporation), cool air having a temperature lower than room temperature is obtained by the vortex effect, and cooling can be performed more effectively. As a result, transformation from a diamond crystal structure to a graphite crystal structure in the diamond grains on the surface of the cutting edge can be suppressed to a moderate amount that does not adversely affect the strength of the cutting edge. The cooling conditions used in combination with the laser processing can be set by appropriately adjusting the operating conditions of the vortex tube.

In addition, as the laser irradiation conditions, it is preferred to specify, as necessary, a laser pulse width of 1 f (femto) seconds or more and 1 μ seconds or less and a laser repetition frequency of 10 Hz or more and 1 MHz or less.

Under these laser irradiation conditions, when the laser spot diameter is less than 5 μm as the half-width, the laser power is low, and therefore finishing of the cutting edge tends to be difficult. When the laser spot diameter exceeds 70 μm as the half-width, the diamond tends to crack because the laser power is high. When the laser focal depth is less than 0.5 mm, finishing of the cutting edge tends to be difficult due to defocusing. When the laser output is less than 1 W at the processing point, finishing of the cutting edge tends to be difficult because the laser power is low. When the laser output exceeds 20 W at the processing point, the diamond tends to crack due to the high laser power.

When the laser scanning speed is less than 5 mm/s, the diamond tends to crack due to the laser penetrating too deep inside the cutting edge. When the laser scanning speed exceeds 100 mm/s, laser processing tends to not to be performed much. When the laser pulse width is less than 1 f second, the processing with the laser tends to take too long, and the laser apparatus tends to be extremely expensive. When the laser pulse width exceeds 1 μ sec, thermal processing becomes dominant, and transformation from a diamond crystal structure of a graphite crystal structure tends to be excessive. When the laser repetition frequency is less than 10 Hz, thermal processing becomes dominant, and transformation from a diamond crystal structure of a graphite crystal structure tends to be excessive. When the laser repetition frequency exceeds 1 MHz, the next laser pulse arrives before the energy of the irradiated laser pulse is consumed at the processing point, so that the thermal load at the processing point increases and transformation from a diamond crystal structure to a graphite crystal structure tends to be excessive.

Other Steps

The diamond tool according to the present embodiment may include a coating covering at least a portion of the cutting edge including the rake face, flank face, and ridgeline where the rake face and the flank face intersect. In this case, as a method for manufacturing the diamond tool according to the present embodiment, it is preferred to include a step of covering the diamond tool with a coating. This step can use a conventionally known method. Examples thereof include physical vapor deposition methods such as ion plating, anion plating, sputtering, and ion mixing. Further, it is also possible to coat the diamond tool with a coating by a chemical vapor deposition method.

Effects

Based on the above, a diamond tool according to the present embodiment can be manufactured. This diamond tool suppresses transformation from a diamond crystal structure to a graphite crystal structure in the diamond grains on the surface of the cutting edge during the finishing of the cutting edge. As a result, for such a the diamond tool, when a ratio $I_{\pi*}/I_{\sigma*}$ between an intensity of a $\pi*$ peak derived from a $\pi$ bond of carbon in the graphite phase and an intensity of a $\sigma*$ peak derived from a $\sigma$ bond of carbon in the graphite phase and a $\sigma$ bond of carbon in the diamond phase is determined for the diamond grains positioned on the surface of the cutting edge by measuring an energy loss associated with excitation of K-shell electrons of carbon by TEM-EELS, the ratio $I_{\pi*}/I_{\sigma*}$ of the diamond grain on a surface of the cutting edge is 0.1 to 2 and a ratio $I_{\pi*}/I_{\sigma*}$ of the diamond grain at a depth position of 0.5 μm in a normal direction to the surface of the cutting edge from the surface of the cutting edge is 0.001 to 0.1. As a result, a diamond tool having improved defect resistance can be obtained by this manufacturing method.

SUPPLEMENTARY NOTES

The above description includes the following embodiments supplementarily added below.

Supplementary Note 1

A diamond tool comprising a diamond at least on a cutting edge, wherein
the diamond includes one or two or more diamond grains,
each diamond grain includes a diamond phase composed of a diamond crystal structure and a graphite phase composed of a graphite crystal structure, and
when a ratio $I_{\pi*}/I_{\sigma*}$ between an intensity of a $\pi*$ peak derived from a $\pi$ bond of carbon in the graphite phase and an intensity of a $\sigma*$ peak derived from a $\sigma$ bond of carbon in the graphite phase and a $\sigma$ bond of carbon in the diamond phase is determined for the diamond grain by measuring an energy loss associated with excitation of K-shell electrons of carbon by electron energy loss spectroscopy using a transmission electron microscope, the ratio $I_{\pi*}/I_{\sigma*}$ of the diamond grain on a surface of the cutting edge is 0.1 to 2 and a ratio $I_{\pi*}/I_{o*}$ of the diamond grain at a depth position of 0.5 μm in a normal direction to the surface of the cutting edge from the surface of the cutting edge is 0.001 to 0.1.

Supplementary Note 2

The diamond tool according to supplementary addition 1, wherein the ratio $I_{\pi*}/I_{o*}$ of the diamond grain on a surface of the cutting edge is 0.6 to 1 and the ratio $I_{\pi*}/I_{o*}$ of the diamond grain at a depth position of 0.5 μm in a normal direction to the surface of the cutting edge from the surface of the cutting edge is 0.002 to 0.01.

Supplementary Note 3

The diamond tool according to supplementary addition 1 or 2, wherein the ratio $I_{\pi*}/I_{o*}$ of the diamond grain at a depth position of 0.2 μm in a normal direction to the surface of the cutting edge from the surface of the cutting edge is 0.002 to 0.01.

EXAMPLES

Hereinafter, the present disclosure will be described in more detail with reference to examples, but the present disclosure is not limited thereto. In the following description, Samples 1 to 9 are examples, and Sample 10 is a comparative example.

Manufacture of Diamond Tool

Sample 1

First Step

To manufacture the turning insert specified by catalog number "NF-DNMA150408" (Sumitomo Electric Industries, Ltd.), a diamond sintered body (PCD) was prepared by using a conventionally known HTHP method (sintering at a pressure of 6 GPa and a temperature of 1500° C. for 15 minutes). The grain size ($D_{50}$) of the diamond grains constituting this PCD was 10 μm.

Second Step

An isosceles triangle having a top angle of 55° (bottom side of 6.5 mm×5 mm height) was cut from the PCD by using a commercially available wire electric discharge machining machine. The shape of the turning insert included a rake face, a flank face, and a ridgeline where the rake face and the flank face intersected, and the rake face was continuous with the flank face via the ridgeline. Further, the shape of the insert turning was constituted from a part of the rake face, a part of the flank face, and the cutting edge at the ridgeline. Specifically, the shape of the insert turning was constituted from the ridgeline and regions 0.5 mm away from the ridgeline on each of the rake face side and the flank face side.

Third Step

A base material was prepared by processing Igetalloy (registered trademark, grade: G10E), which is a cemented carbide manufactured by Sumitomo Electric Industries, Ltd. This base material and the PCD cut into the isosceles triangle were joined by brazing.

Fourth Step

After forming a cutting edge by grinding the PCD joined to the base material, the cutting edge was finished by performing laser processing under the following irradiation conditions on only the flank face side of the cutting edge.

Irradiation Conditions

Laser wavelength: 1064 nm
Laser spot diameter: 40 μm (half width)
Laser focal depth: 1.5 mm
Laser output: 5 W (processing point)
Laser scanning speed: 10 mm/min
Laser pulse width: 10 ps (picoseconds)
Laser repetition frequency: 200 kHz As a result, a turning insert (diamond tool) of Sample 1 was obtained. The turning insert of Sample 1 has a diamond (PCD) at least on the cutting edge. The diamond (PCD) includes two or more diamond grains. In the diamond grains located on the surface of the cutting edge, a diamond phase composed of a diamond crystal structure and a graphite phase composed of a graphite crystal structure are formed by the fourth step.

Sample 2

A turning insert (diamond tool) of Sample 2 was obtained by using the same method as for Sample 1, except that in the fourth step laser processing was performed under the same conditions as for Sample 1 on only the rake face side of the cutting edge composed of diamond (PCD).

Sample 3

A turning insert (diamond tool) of Sample 3 was obtained by using the same method as for Sample 1, except that in the fourth step laser processing was performed under the same conditions as for Sample 1 on both the flank face side and the rake face side of the cutting edge composed of diamond (PCD).

Sample 4

A turning insert (diamond tool) of Sample 4 was obtained by using the same method as for Sample 1, except that in the fourth step, when laser processing the flank face side of the cutting edge composed of diamond (PCD), the workpiece was cooled by spraying compressed air using a vortex tube (manufactured by Kogi Corporation) on the flank face side of the cutting edge, and the laser output was set to 10 W.

Sample 5

A turning insert (diamond tool) of Sample 5 was obtained by using the same method as for Sample 2, except that in the fourth step, when laser processing the rake face side of the cutting edge composed of diamond (PCD), the workpiece was cooled by spraying compressed air using a vortex tube (manufactured by Kogi Corporation) on the rake face side of the cutting edge, and the laser output was set to 10 W.

Sample 6

A turning insert (diamond tool) of Sample 6 was obtained by using the same method as for Sample 3, except that in the fourth step, when laser processing both the flank face side and the rake face side of the cutting edge composed of diamond (PCD), the workpiece was cooled by spraying compressed air using a vortex tube (manufactured by Kogi Corporation) on both the flank face side and the rake face side of the cutting edge, and the laser output was set to 10 W.

Sample 7

A turning insert (diamond tool) of Sample 7 was obtained by using the same method as for Sample 1, except that in the fourth step, when laser processing the flank face side of the cutting edge composed of diamond (PCD), the workpiece was cooled by spraying compressed air using a vortex tube (manufactured by Kogi Corporation) on the flank face side of the cutting edge, and the laser output was set to 3 W.

Sample 8

A turning insert (diamond tool) of Sample 8 was obtained by using the same method as for Sample 2, except that in the fourth step, when laser processing the rake face side of the cutting edge composed of diamond (PCD), the workpiece was cooled by spraying compressed air using a vortex tube (manufactured by Kogi Corporation) on the rake face side of the cutting edge, and the laser output was set to 3 W.

Sample 9

A turning insert (diamond tool) of Sample 9 was obtained by using the same method as for Sample 3, except that in the fourth step, when laser processing both the flank face side and the rake face side of the cutting edge composed of diamond (PCD), the workpiece was cooled by spraying compressed air using a vortex tube (manufactured by Kogi Corporation) on both the flank face side and the rake face side of the cutting edge, and the laser output was set to 3 W.

Sample 10

A turning insert (diamond tool) of Sample 10 was obtained by using the same method as for Sample 3, except that, instead of laser processing, in the fourth step grinding was performed using a grindstone on both the flank face side and the rake face side of the cutting edge composed of diamond (PCD).

Measurement of Graphite Abundance Ratio (Ratio $I_{\pi^*}/I_{\sigma^*}$)

For each diamond grain located on the surface of the cutting edge (both flank face side and rake face side) of the turning inserts of Samples 1 to 10, the ratio $I_{\pi^*}/I_{\sigma^*}$ of the diamond grain on the surface of the cutting edge, the ratio $I_{\pi^*}/I_{\sigma^*}$ of the diamond grain at a depth position of 0.2 μm in a normal direction to the surface of the cutting edge from the surface of the cutting edge, and the ratio $I_{\pi^*}/I_{\sigma^*}$ of the diamond grain at a depth position of 0.5 μm in a normal direction to the surface of the cutting edge from the surface of the cutting edge were each determined by performing the above-described measurement method using TEM-EELS. The results are shown in Table 1.

Cutting Test (Defect Resistance Test)

Using the turning inserts of Samples 1 to 10, a cemented carbide (VM-40 (dimensions: φ60 mm in diameter×length 100 mm) and hardness: HRA88) were prepared as work material, and the work material was cut under the following cutting conditions. In this cutting test, the cutting was halted at the point when the size of either a defect or a chip on the cutting edge due to the cutting of the work material exceeded 0.1 mm, and the time (units: minutes) from the start of the test to that point was evaluated. The longer this time, the better the defect resistance can be evaluated to be. The results are shown in the item "Defect Resistance (mins)" in Table 1.

Cutting Conditions

Processing machine: Lathe
Cutting speed Vc: 10 m/min
Feed rate f: 0.05 mm/rev
Cutting amount ap: 0.05 mm/rev
Cutting oil (coolant): None

TABLE 1

|  | Rake face side (ratio $I_{\pi^*}/I_{\sigma^*}$) | | | Flank face side (ratio $I_{\pi^*}/I_{\sigma^*}$) | | | Performance |
| --- | --- | --- | --- | --- | --- | --- | --- |
|  | Surface | Depth 0.2 μm | Depth 0.5 μm | Surface | Depth 0.2 μm | Depth 0.5 μm | Defect resistance (min) |
| Sample 1 | 0.005 | 0.005 | 0.005 | 0.9 | 0.5 | 0.005 | 15 |
| Sample 2 | 0.8 | 0.5 | 0.006 | 0.006 | 0.006 | 0.006 | 16 |
| Sample 3 | 1 | 0.5 | 0.005 | 1 | 0.5 | 0.005 | 19 |
| Sample 4 | 0.006 | 0.006 | 0.006 | 0.7 | 0.2 | 0.006 | 21 |
| Sample 5 | 0.7 | 0.2 | 0.005 | 0.005 | 0.005 | 0.005 | 20 |
| Sample 6 | 0.6 | 0.2 | 0.005 | 0.6 | 0.2 | 0.005 | 28 |
| Sample 7 | 0.005 | 0.005 | 0.005 | 0.6 | 0.005 | 0.005 | 31 |
| Sample 8 | 0.7 | 0.006 | 0.006 | 0.006 | 0.006 | 0.006 | 30 |
| Sample 9 | 0.6 | 0.005 | 0.005 | 0.6 | 0.005 | 0.005 | 41 |
| Sample 10 | 0.005 | 0.005 | 0.005 | 0.005 | 0.005 | 0.005 | 10 |

Discussion

The turning inserts of Sample 1, Sample 2, Sample 4, Sample 5, Sample 7, and Sample 8 are examples in which a diamond tool was manufactured so that as a result of the above-described fourth step, the diamond grains located on the surface of any one of the rake face side and the flank face side of the cutting edge had a ratio $I_{\pi^*}/I_{\sigma^*}$ of the diamond grain on the surface of the cutting edge of 0.1 to 2 and a ratio $I_{\pi^*}/I_{\sigma^*}$ of the diamond grain at a depth position of 0.5 μm in a normal direction to the surface of the cutting edge from the surface of the cutting edge of 0.001 to 0.1. The end mills of Sample 3, Sample 6, and Sample 9 are examples in which a diamond tool was manufactured so that as a result of the above-described fourth step, the diamond grains located on the surface of both the rake face side and the flank face side of the cutting edge had a ratio $I_{\pi*}/I_{\sigma*}$ of the diamond grain on the surface of the cutting edge of 0.1 to 2 and a ratio $I_{\pi*}/I_{\sigma*}$ of the diamond grain at a depth position of 0.5 μm in a normal direction to the surface of the cutting edge from the surface of the cutting edge of 0.001 to 0.1. The turning insert of Sample 10 is an example in which a diamond tool was manufactured by grinding using a conventional grindstone.

According to Table 1, it can be seen that the turning inserts of Samples 1 to 9 have improved defect resistance compared with the turning insert of Sample 10. As a result it can be evaluated that the turning inserts (diamond tools) of Samples 1 to 9 has improved defect resistance compared with the conventional method. According to Table 1, it can also be seen that the turning insert of Sample 3 has better defect resistance than Sample 1 and Sample 2, the turning insert of Sample 6 has better defect resistance than Sample 4 and Sample 5, and the turning insert of Sample 9 has better defect resistance than Sample 7 and Sample 8.

Further, in view of the results of Samples 1 to 10, it is suggested that even when the diamond tools of the present disclosure have a SCD, or have a BLPCD, on the cutting edge, as a result of being manufactured with the same way as Sample 1 to Sample 9, defect resistance is improved compared to diamond tools manufactured by grinding using a grindstone The embodiments and examples of the present disclosure have been described in the manner above, but it is expected from the beginning that the configurations of those embodiments and examples are to be appropriately combined or modified in various ways.

The embodiments and examples of disclosed herein are exemplary illustrations in all respects and should not be considered as being limiting. The scope of the present invention is defined by the scope of claims, and not by the above embodiments and examples, and is intended to include equivalent meanings as those of the claims and even all modifications within the scope thereof.

REFERENCE SIGNS LIST

11 first region, 11a depth position of 0.2 μm in the normal direction to the surface of the cutting edge from the surface of the cutting edge, 12 second region 12a depth position of 0.5 μm in a normal direction to the surface of the cutting edge from the surface of the cutting edge, 13 cutting edge internal region, 20 diamond grain

The invention claimed is:

1. A diamond tool comprising a diamond at least on a cutting edge, wherein
    the diamond includes one or two or more diamond grains,
    each diamond grain includes a diamond phase composed of a diamond crystal structure and a graphite phase composed of a graphite crystal structure, and
    when a ratio $I_{\pi*}/I_{\sigma*}$ between an intensity of a $\pi*$ peak derived from a $\pi$ bond of carbon in the graphite phase and an intensity of a $\sigma*$ peak derived from a $\sigma$ bond of carbon in the graphite phase and a $\sigma$ bond of carbon in the diamond phase is determined for the diamond grain by measuring an energy loss associated with excitation of K-shell electrons of carbon by electron energy loss spectroscopy using a transmission electron microscope, the ratio $I_{\pi*}/I_{\sigma*}$ of the diamond grain on a surface of the cutting edge is 0.1 to 2 and the ratio $I_{\pi*}/I_{\sigma*}$ of the diamond grain at a depth position of 0.5 μm in a normal direction to the surface of the cutting edge from the surface of the cutting edge is 0.001 to 0.1.

2. The diamond tool according to claim 1, wherein the ratio $I_{\pi*}/I_{\sigma*}$ of the diamond grain at a depth position of 0.2 μm in a normal direction to the surface of the cutting edge from the surface of the cutting edge is 0.001 to 0.1.

3. The diamond tool according to claim 1, wherein the diamond is a single crystal diamond, a binderless polycrystalline diamond, or a polycrystalline sintered diamond.

4. The diamond tool according to claim 1, wherein
    the diamond tool includes a rake face, a flank face, and a ridgeline where the rake face and the flank face intersect,
    the rake face is continuous with the flank face via the ridgeline,
    the cutting edge of the diamond tool is constituted from a part of the rake face, a part of the flank face, and the ridgeline, and
    the surface of the cutting edge is at least a part of the surfaces of the cutting edge.

* * * * *